United States Patent
Wei

(10) Patent No.: US 8,907,456 B2
(45) Date of Patent: Dec. 9, 2014

(54) MULTI-MATERIAL HARD MASK OR PREPATTERNED LAYER FOR USE WITH MULTI-PATTERNING PHOTOLITHOGRAPHY

(75) Inventor: Haiqing Wei, San Jose, CA (US)

(73) Assignee: Olambda, Inc., Los Altos, CA (US)

( * ) Notice: Subject to any disclaimer, the term of this patent is extended or adjusted under 35 U.S.C. 154(b) by 1174 days.

(21) Appl. No.: 12/532,308

(22) PCT Filed: Mar. 20, 2008

(86) PCT No.: PCT/US2008/003820
§ 371 (c)(1),
(2), (4) Date: Mar. 19, 2010

(87) PCT Pub. No.: WO2008/115600
PCT Pub. Date: Sep. 25, 2008

(65) Prior Publication Data
US 2010/0187658 A1    Jul. 29, 2010

Related U.S. Application Data

(60) Provisional application No. 60/896,246, filed on Mar. 21, 2007.

(51) Int. Cl.
| H01L 29/06 | (2006.01) |
| H01L 21/31 | (2006.01) |
| H01L 21/768 | (2006.01) |
| H01L 21/033 | (2006.01) |
| H01L 21/308 | (2006.01) |
| H01L 21/311 | (2006.01) |
| H01L 21/3213 | (2006.01) |

(52) U.S. Cl.
CPC ...... *H01L 21/76816* (2013.01); *H01L 21/0337* (2013.01); *H01L 21/0338* (2013.01); *H01L 21/3086* (2013.01); *H01L 21/3088* (2013.01); *H01L 21/31144* (2013.01); *H01L 21/32139* (2013.01); *Y10S 977/888* (2013.01)
USPC .............. 257/618; 438/736; 216/54; 977/888

(58) Field of Classification Search
USPC ............. 438/736; 216/54; 430/323; 977/887, 977/888; 257/618
See application file for complete search history.

(56) References Cited

U.S. PATENT DOCUMENTS

| 5,858,580 | A | 1/1999 | Wang et al. |
| 6,913,701 | B2 | 7/2005 | Moon et al. |
| 7,432,120 | B2 * | 10/2008 | Mascolo et al. ............... 438/42 |
| 7,521,274 | B2 * | 4/2009 | Hersee et al. ................. 977/816 |
| 8,012,881 | B1 * | 9/2011 | Lee et al. ..................... 438/736 |
| 2003/0059720 | A1 | 3/2003 | Hwang et al. |
| 2006/0003588 | A1 * | 1/2006 | Lindsay et al. ............... 438/694 |
| 2007/0111467 | A1 * | 5/2007 | Kim .............................. 438/424 |
| 2007/0148599 | A1 | 6/2007 | True |

(Continued)

*Primary Examiner* — Telly Green
*Assistant Examiner* — Toniae Thomas
(74) *Attorney, Agent, or Firm* — Cooper & Dunham, LLP

(57) ABSTRACT

A method of fabricating integrated circuits is described. A multi-material hard mask is formed on an underlying layer to be patterned. In a first patterning process, portions of the first material of the hard mask are etched, the first patterning process being selective to etch the first material over the second material. In a second patterning process, portions of the second material of the hard mask are etched, the second patterning process being selective to etch the second material over the first material. The first and second patterning processes forming a desired pattern in the hard mask which is then transferred to the underlying layer.

38 Claims, 13 Drawing Sheets

(56) References Cited

U.S. PATENT DOCUMENTS

| | | | |
|---|---|---|---|
| 2007/0164458 A1* | 7/2007 | Ogino et al. | 257/797 |
| 2008/0085612 A1* | 4/2008 | Smythe et al. | 438/787 |
| 2008/0093743 A1* | 4/2008 | Yang et al. | 257/758 |
| 2008/0311527 A1* | 12/2008 | Kim et al. | 430/313 |
| 2008/0318169 A1* | 12/2008 | Taniguchi | 430/323 |
| 2009/0305173 A1* | 12/2009 | Xiao et al. | 430/324 |
| 2010/0167214 A1* | 7/2010 | Yoon et al. | 430/323 |
| 2011/0147337 A1* | 6/2011 | Lee | 216/13 |

* cited by examiner

| A | B | C | D | A | B | C | D | A | B | C | D |
|---|---|---|---|---|---|---|---|---|---|---|---|
| C | D | A | B | C | D | A | B | C | D | A | B |
| A | B | C | D | A | B | C | D | A | B | C | D |
| C | D | A | B | C | D | A | B | C | D | A | B |
| A | B | C | D | A | B | C | D | A | B | C | D |
| C | D | A | B | C | D | A | B | C | D | A | B |
| A | B | C | D | A | B | C | D | A | B | C | D |
| C | D | A | B | C | D | A | B | C | D | A | B |

Fig. 13

| A | B | A | B | A | B | A | B | A | B | A | B |
|---|---|---|---|---|---|---|---|---|---|---|---|
| C | D | C | D | C | D | C | D | C | D | C | D |
| A | B | A | B | A | B | A | B | A | B | A | B |
| C | D | C | D | C | D | C | D | C | D | C | D |
| A | B | A | B | A | B | A | B | A | B | A | B |
| C | D | C | D | C | D | C | D | C | D | C | D |
| A | B | A | B | A | B | A | B | A | B | A | B |

Fig. 14

MULTI-MATERIAL HARD MASK OR PREPATTERNED LAYER FOR USE WITH MULTI-PATTERNING PHOTOLITHOGRAPHY

CROSS-REFERENCE TO RELATED APPLICATIONS

This patent application claims the benefit of U.S. Ser. No. 60/896,246, filed on Mar. 21, 2007, entitled "Multiple Exposure and Patterning Using a Periodically Patterned Hard-Mask Consisting of Chemically Selective Materials Under a Photoresist Film," which is incorporated by reference herein.

FIELD

This patent specification relates to microfabrication of devices such as integrated devices. More particularly, the patent specification relates to improved design and manufacture of integrated circuits (ICs) through photolithographic and patterning processes. Even more particularly, the patent specification relates multi-material hard masks for use with patterning lithography in the manufacture of ICs.

BACKGROUND

In the fabrication of integrated devices and circuits, photolithography or optical lithography is used to selectively remove parts of a thin film layer or a part of the substrate. The process conventionally uses light to transfer a pattern from a photomask to a light-sensitive chemical (photoresist, or simply "resist") on the substrate (or other layer). A series of treatments then engraves the exposure pattern into the materials underlying the photoresist. In a complex IC, a wafer will go through the photolithographic cycle up to 50 times.

In conventional photolithography the mask patterns encode and image to resemble the intended patterns (the "design intent") to be created on the underlying wafer layer. An exposure system typically produces an image on the wafer using the mask. An illumination system shines light through the mask blocking it in some areas and letting it pass in others. Most VLSI lithography uses a projection system in which a mask (also called a "reticle") to create patterns for a single or small number of chips or dies. The projection system (also called a "scanner" or "stepper") projects the mask image onto the wafer many times to create the complete wafer pattern. The pattern on the mask is typically projected and reduced by four times on the wafer surface.

Current state-of-the-art photolithography tools use deep ultraviolet (DUV) light with wavelengths of 248 and 193 nm for feature sizes or critical dimensions (CDs) down to about 32 nm. The DUV light is typically produced by excimer lasers, with Krypton fluoride producing a 248 nm spectral line and argon fluoride a 193 nm line.

Double exposure techniques use a sequence of two separate exposures of the same photoresist layer using two different photomasks. This technique has been proposed for patterns in the same layer that look very different or have incompatible densities or pitches. In one case, the two exposures may each consist of lines that are oriented in one or the other of two usually perpendicular directions. In another case using alternating phase-shifting mask (alt-PSM), two exposures are needed to resolve conflicts in phase assignments of the phase shifters. See, e.g., U.S. Pat. No. 5,858,580. In still another case, two exposures are used to produce images corresponding to the real and imaginary parts of a complex-valued mask transmittance function (See for example, Y. C. Pati and T. Kailath, "Phase-shifting masks for microlithography: automated design and mask requirements," *J. Opt. Soc. Am. A*, vol. 11, no. 9, pp. 2438-2452, September 1994). Although double exposure as a particular technique enhances the resolution of resist image, the obtainable CD and especially pitch of patterns are still fundamentally limited by optical diffraction.

In order to further enhance feature density while avoiding infrastructure changes, various multiple patterning technologies have been proposed to fraction the pitch of patterns as limited by optical imaging (thus multiply the pattern density). Multiple patterning offers the advantage of scanner/stepper re-use for more than one technology generation, by allowing pitch to shrink. In a typical two-exposure double patterning process using either positive or negative photoresists or hard masks, a first exposure defines a first set of patterns in a first photoresist film, which are transferred onto a film of hard mask by an etching process, then the first photoresist film is removed and a second photoresist film is coated; Subsequently, a second exposure defines a second set of patterns in the second photoresist film, which are transferred onto the film of hard mask by an etching process, then the second photoresist film is removed; Finally, another etching process transfers the patterns in the hard mask onto the underlying device layer.

Another technique of double patterning has been proposed using "spacer masks", where only one exposure is used to build "posts", and then a spacer mask material is deposited to surround the posts. Spacers are formed by deposition or reaction of the film on the posts. Then an etching or chemical mechanical polishing (CMP) step may be employed to remove the spacer material on the top surfaces of the posts, leaving only the material on the sidewalls. By removing the original post patterns, only the spacers are left. Since there are two spacers for each line of post, the line density is effectively doubled. This "spacer mask" technique saves one exposure, but it lacks design flexibility, due to the fact that spacer lines must be generated in pairs. Other issues with the spacer mask approach include: (1) whether the spacers will stay in place after the post material is removed, (2) whether the spacer profile is acceptable, and (3) whether the underlying material is etched when removing the post material. Pattern transfer is complicated by the situation where removal of the post material also removes some of the underlying material, which results in uneven topography between the two sides of a spacer.

Another double pattering technique has been referred to as a "heterogeneous mask" technique, wherein a first exposure and development of photoresist transfers patterns to an underlying hard mask layer. After the photoresist being removed, a second layer of photoresist is coated. This second layer undergoes a second exposure and development, forming patterns in between the features patterned in the hard mask layer. The surface pattern is therefore a combination of photoresist features and hard mask features. This pattern is then transferred into the final layer underneath, with the prospect of increasing the feature density. A concern with the use of the hetorogeneous mask approach is the large discrepancy in mechanical and chemical properties between the second photoresist (usually a polymer) pattern and the first hard mask (often an inorganic) pattern, resulting in additional sources of variations in CD uniformity and etching rate. For further details on various techniques of double patterning, see for example, W. Arnold, M. Dusa, and J. Finders, "Metrology challenges for double exposure and double patterning," *Proc. SPIE*, vol. 6518, 651802, 2007; Y. Nagaoka and H. Watanabe, "PMJ 2007 Panel Discussion Overview: double exposure and double patterning for 32-nm half-pitch design node," *Proc. SPIE*, vol. 6730, 673006, 2007; and J. Finders, M. Dusa, and S. Hsu, "Double patterning lithography: The bridge between low $k_1$ ArF and EUV," *Microlithography World*, vol. 17, no. 1, pp. 2, 4-6, 12, February, 2008.

The above techniques of double patterning may be extended to multi-patterning ones (also known as "intermediate pattern accumulation" techniques), which involve a sequence of multiple separate exposures and etchings of different patterns into the same layer of hard mask. For each exposure, a different photoresist coating may be used. When the sequence is completed, the pattern in the hard mask is a composite of the previously etched subpatterns as transferred from previous resist patterns generated by the multiple exposures and resist developments. By interleaving the subpatterns, the pattern density could theoretically be increased indefinitely beyond the Rayleigh limit of optical imaging, with an effective pitch being inversely proportional to the number of subpatterns.

The above described multiple patterning techniques have drawbacks and are associated with technical difficulties. Apart from the particular issues concerning each specific technique, a general problem is the stringent requirement of overlay among subpatterns, as the positioning of another subpattern relative to the existing subpattern(s) determines the spacing size. Substantially higher precision is required for lithography tool overlay, reticle-to-reticle overlay, and reticle-to-reticle CD and figure placement matching, etc. Overlay error induced pattern mismatches and CD nonuniformity may be significant sources of process variations that limit chip yield and performance.

The above described multiple patterning techniques face further general difficulties in the optical imaging process due to the smaller feature sizes of subpatterns, which reduce tolerances to exposure dose and focus variations, mask errors, and projection optics imperfections, hence result in smaller process windows. As an overly simplified example, a 100 nm process with a 10 nm tolerance may have to be tightened to a 5 nm tolerance before application to a 50 nm process using a double patterning strategy.

Still further, there is the general problem of pattern splitting conflict. Splitting a design between two or more complementary masks may be conveniently done only for highly repetitive patterns like those in random access memory or flash memory chips. Pattern splitting becomes substantially more difficult for logic chip patterns that are less regular. If a line needs to be split in the middle and stitched back together, seamless stitching can be challenging. Even with perfect overlays, a location having two line segments stitched together could hardly be as clean as a whole line being printed in one shot. Therefore, when a line needs to be split, the splitting location has to be carefully chosen to minimize the impact to device performance. Unfortunately, such pattern splitting considerations increases the complexity of chip design.

Accordingly, there is a need for a lithography technique to significantly decrease the minimum feature size, and increase the pattern density, without requiring major infrastructure changes, while avoiding the above-mentioned problems associated with known multiple patterning techniques. In particular, there is a need for a multi-exposure multi-patterning technique that relaxes the overlay requirements to lithography tools and photomasks, enlarges tolerances to optical imaging process variations, and does not incure the problem of pattern splitting conflict.

SUMMARY

In one embodiment, a method of microfabricating devices is provided including forming a hard mask on an underlying layer to be patterned, the hard mask having at least a first material and a second material, with the first and second materials having substantially different chemical properties. In a first patterning process, portions of the first material of the hard mask are etched, the first patterning process being selective to etch the first material over the second material. In a second patterning process, portions of the second material of the hard mask are etched, the second patterning process being selective to etch the second material over the first material, the first and second patterning processes forming a pattern in the hard mask. The pattern in the hard mask is then transferred to the underlying layer.

According to other embodiments, the hard mask can include a plurality of interfaces between the first material and the second material, with the interfaces being substantially perpendicular to the underlying layer covered by the hard mask. The first and second materials of the hard mask can be arranged in a periodic pattern in which the interfaces are substantially parallel to each other in a first direction. The first and second materials and the interfaces thereof can also form part of a first layer of the hard mask being substantially parallel to the underlying layer, and the hard mask may include a second layer having material interfaces that are substantially parallel to each other and substantially perpendicular to the first direction.

According to other embodiments, the hard mask can include a plurality of interfaces between the first material and the second material, with the interfaces being substantially perpendicular to the underlying layer covered by the hard mask. The first and second materials of the hard mask can be arranged into a two-dimensional periodic pattern, in which a first set of interfaces are substantially parallel to each other in a first direction, and a second set of interfaces are substantially parallel to each other in a second direction.

According to other embodiments, a method of fabricating a multi-material hard mask for use in the fabrication of integrated circuits is provided, including forming a layer of a first material on a device layer to be patterned; patterning the layer of first material into a regular periodic pattern of alternating portions of first material and gaps between the first material; and depositing a layer of a second material into the gaps between the first material.

According to yet other embodiments, a microfabricated device manufactured using a process as described above is provided.

BRIEF DESCRIPTION OF THE DRAWINGS

FIGS. 11-14 are plan views illustrating arrangements of multiple materials of a hard mask on a single vertical layer.

DETAILED DESCRIPTION

In the following detailed description of embodiments, reference is made to accompanying drawings, which form a part hereof, and within which are shown by way of illustration specific embodiments by which the invention may be practiced. It is to be understood that other embodiments may be utilized and structural changes may be made without departing from the scope of the invention.

Figure 1:
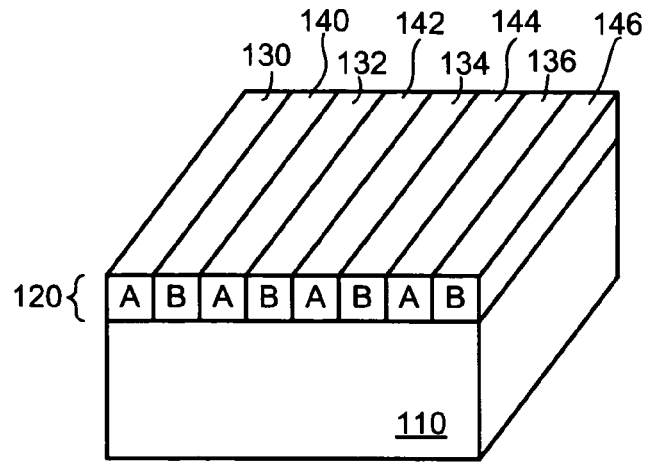
FIG. 1 shows an example of a portion of a multi-material hard mask, according to embodiments.

FIG. 1 shows an example of a portion of a multi-material hard mask, according to embodiments. Layer 110 can be a substrate, for example, a silicon wafer, or it can be a layer overlaying such a substrate. A multi-material hard mask 120 is provided above the underlying layer 110. The mask 120, in this example includes two different materials, "Material A" and "Material B." Material A is used in portions 130, 132, 134 and 136 of hard mask 120, and Material B is used in portions 140, 142, 144 and 146 of hard mask 120. In the example of FIG. 1, the two materials are shown in a regular alternating periodic stripe pattern. The pattern of the two materials in hard mask 120 can continue over the whole of the silicon wafer, or it can be generated for certain areas. As used herein the term "hard mask" refers to a sacrificial layer into which a pattern is formed and subsequently transferred into material of the underlying layer. As a hard mask may consist of multiple materials that have substantially different chemical properties, it is referred as a "multi-material" hard mask.

Figure 2A:
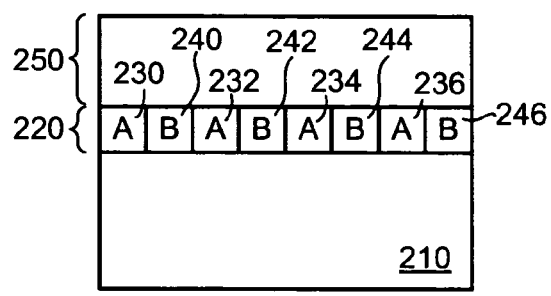
FIGS. 2*a*-2*f* illustrate steps for using a multi-material hard mask in patterning of an underlying layer, according to embodiments.

FIGS. 2a-2f illustrate steps for using a multi-material hard mask in patterning of an underlying layer, according to embodiments. FIG. 2a shows cross-sectional view of a layer 210 underlying a multi-material hard mask 220. As in the case of FIG. 1, layer 210 can be a substrate of semiconductor or other materials that may be used in microfabricating integrated devices such as integrated circuits. Hard mask 220 includes two different materials, "Material A" and "Material B." Material A is used in portions 230, 232, 234 and 236 of hard mask 220, and Material B is used in portions 240, 242, 244 and 246 of hard mask 220. In the example of FIG. 2a, the two materials are shown in a regular alternating periodic stripe pattern. Photoresist layer 250 is formed on top of the hard mask 220 using a standard known technique such as spin coating.

Figure 2B:
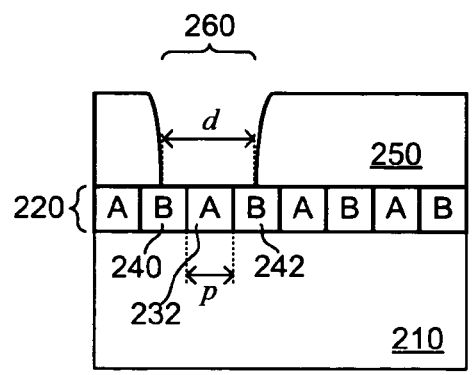

FIG. 2b shows the effect of a first exposure and development step to selectively remove region 260 of resist layer 250 that covers portion 232 of hard mask 220. The exposure system makes use of a photomask, not shown, as is well known in the art. Due to inherent limitations such as the wavelength of light used and the ability of the projection lens system to capture high diffraction orders from the illuminated mask, a limit to the minimum feature size d exists for the resist exposure and development process. In general the minimum feature size that a projection system can print is given approximately by:

$$F = k_1 \frac{\lambda}{N.A.} \quad (1)$$

where F is the minimum feature size (also known as the minimally resolved feature, or simply, the resolution), $k_1$ is a coefficient (known as the "$k_1$ factor") that encapsulates process related factors, which is typically around 0.5, but can be as low as 0.3 under certain circumstances, $\lambda$ is the wavelength of light used, and N.A. is the numerical aperture of the lens as seen from the wafer (See for example, H. J. Levinson, Principles of Lithography, 2nd Ed., Chapter 10, "The limits of optical lithography," pp. 331-354, SPIE Press, Bellingham, Wash., USA, February 2005). Thus, using a known exposure and development system, the minimum feature size d=F as shown in FIG. 2b. The width of the alternating portions of Material A and Material B in hard mask 220, shown in FIG. 2b as p (the "half pitch" of the alternating material portions). Note that when d>p, parts of Material B portions 240 and 242 may be uncovered in addition to Material A portion 232.

Figure 2C:
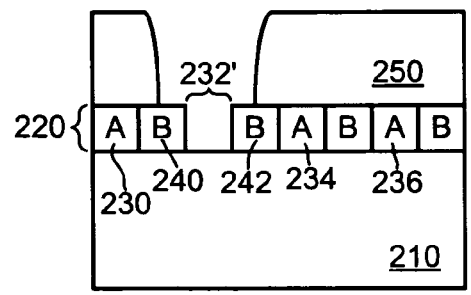

In FIG. 2c, Material A is removed using a process that selectively removes Material A but not Material B. Thus Material A has been removed from region 232', but Material B portions 240 and 242 of hard mask 220 remain. Note that the other portions 230, 234 and 236 of Material A of hard mask 220 are protected by resist 250. Further detail on examples of material-selective etching processes to remove Material A, while leaving Material B intact, will be provided below.

Figure 2D:
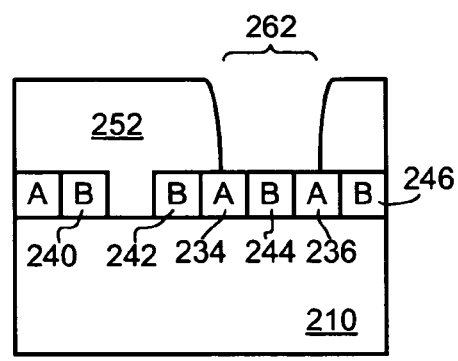

Following the selective etching of Material A, the remaining portion of resist layer 250 is washed away. In FIG. 2d, a new layer 252 of photoresist is provided which has been exposed and developed to selectively remove a region 262 of resist layer 252 above Material B portion 244. Again, due to limitations in the minimum feature size from the exposure and development systems, part of adjacent Material A portions 234 and 236 may become uncovered. However, the Material B portions 240, 242 and 246 that are meant to stay in place are protected by the resist layer 252.

Figure 2E:
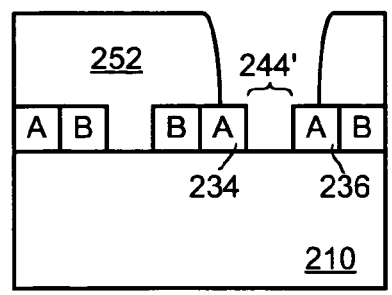
Figure 2F:
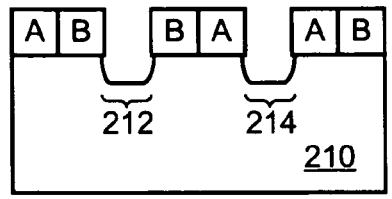

In FIG. 2e Material B is removed using a process that selectively removes Material B but not Material A. Thus Material B has been removed from region 244', but Material A portions 234 and 236 of hard mask 220 remain. Following the selective etching of Material B, the resist layer 252 is washed away to yield patterned hard mask consisting of selected portions of Material A and Material B that cover the underlying layer 210. In FIG. 2f, the regions of exposed underlying layer 210 can be processed according to the desired design of the device. For example, in the case where layer 210 is or consists of a polysilicon gate layer on a wafer substrate, Regions 212 and 214 of polysilicon can be etched away using a plasma etching process. Thus, the etching step transfers the patterns from the hard mask to the underlying layer on the wafer. Note that the width dimension of etched regions 212 and 214 can be made substantially smaller than would be possible using the photolithography system alone.

It is noted that, although not explicitly shown in the cross-sectional views of FIGS. 2a-2e, in each sequence of lithography steps of photoresist exposure, development, and pattern transfer, the optical images formed in the photoresist layer are two-dimensional in general, so are the developed resist patterns and the patterns transferred into the hard mask, thus each individual strip of Material A or B may be segmented into separate bars, and collections of such hard mask bars of Material A and B constitute complex two-dimensional patterns that have a smaller pitch and higher CD uniformity in the material-AB-alternating direction than the other. Nevertheless, such hard mask patterns are rightly suitable to fabricate device layers that have relaxed requirements of resolution and CD uniformity in one direction than the other.

Figure 3:
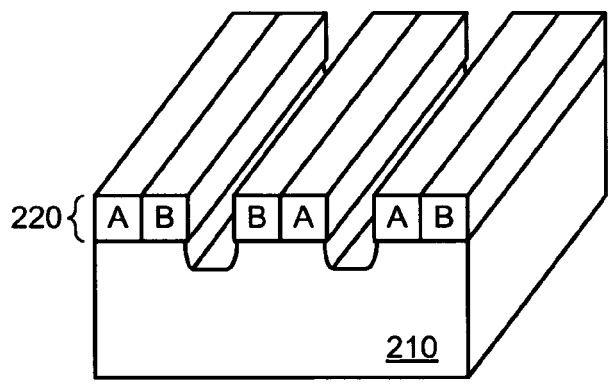
FIG. 3 shows an example of an etched wafer using the hard mask arrangement and process described with respect to FIGS. 2*a*-2*f*.

FIG. 3 shows an example of an etched wafer 210 using the hard mask arrangement and process described with respect to FIGS. 2a-2f. Note that the periodicity of the hard mask 220 makes its preparation easier, the resolution requirement of optical imaging onto resist is relaxed, and there is no issue in overlaying hard mask patterns between the multiple exposure steps. In effect, such multi-exposure multi-pattering technique using a multi-material hard mask decreases the $k_1$ factor by a factor that is approximately the number of different materials constituting the hard mask. In this example, the resulted linewidths and spacings on wafer are effectively digitized, which impose a certain constraint on possible circuit layouts, but greatly enhance the uniformity and controllability of pattern dimensions. Such digitized patterning techniques are rightly suitable for fabricating chips designed under the so-called Restricted Design Rules (RDRs) that require patterns to be on a regular grid to boost pattern regularity. Furthermore, the digitization of hard mask and hence wafer patterns would greatly reduce pattern and device variability induced by process variations during optical projection and chemical processing, including but not limited to changes of exposure dose and defocus, mask errors, lens aberrations, resist development and dry/wet etching variations.

Figure 4:
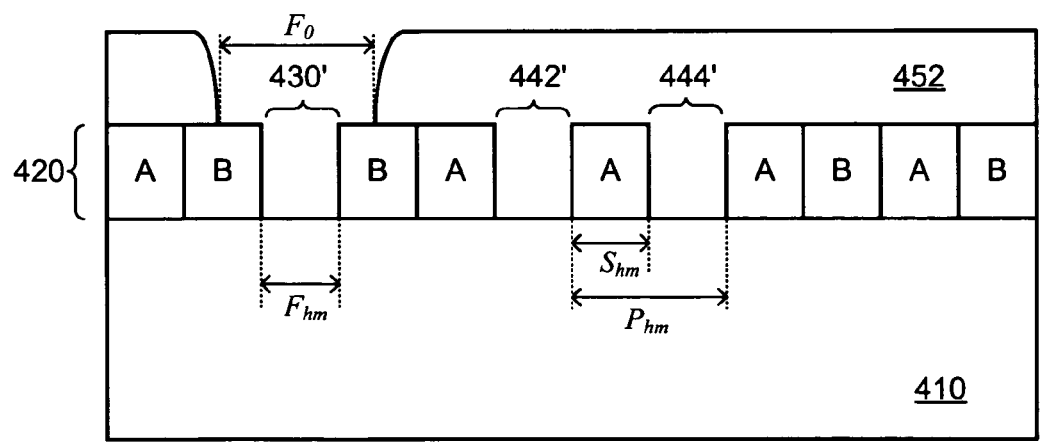
FIG. 4 shows another example of a multi-material hard mask used for patterning a substrate.

FIG. 4 shows another example of a multi-material hard mask used for patterning a substrate. Hard mask 420 is made up of alternating strips of Material A and Material B, overlying a substrate 410, as has been described. In this example, Material B has been removed in regions 442' and 444' by a previous round of resist coating, exposure, resist development and selective etching as has been described. A second resist layer 452 has been patterned through exposure and developing, and Material A has been removed from region 430' of hard mask 420. It can be seen from the example in FIG. 4, that the feature size $F_{hm}$ is significantly smaller than the feature size of $F_0$ of conventional resist exposure and development process. Additionally, it can be seen that the spacing distance between features $S_{hm}$, and the pitch $P_{hm}$ from feature to feature is smaller than would have been possible with a minimum feature size of $F_0$. Again, the $k_1$ factor is effectively reduced approximately by a factor of the number of different materials constituting the hard mask.

Figure 5:
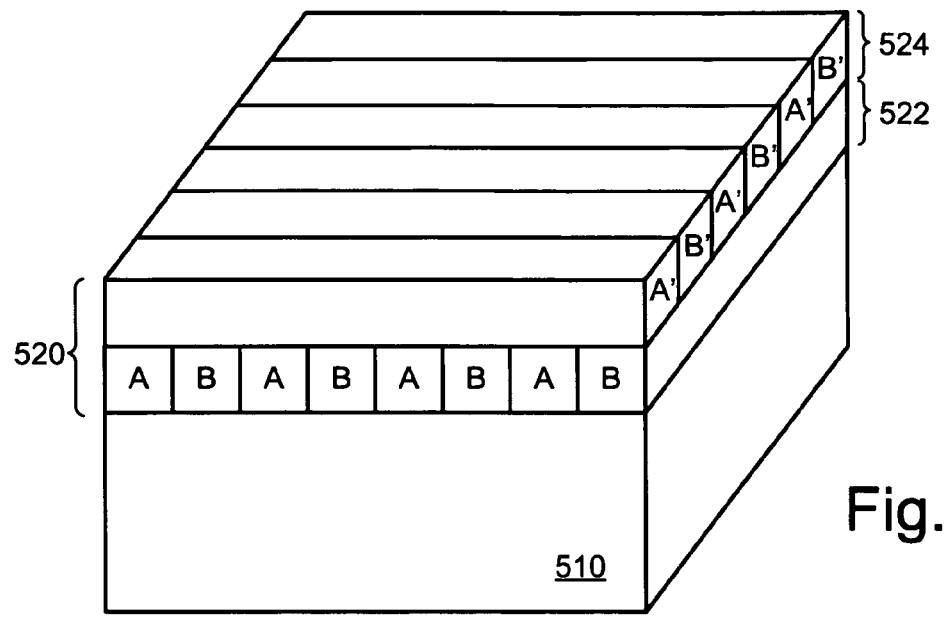
FIG. 5 shows an example of a portion of a multi-material hard mask, according to embodiments.

FIG. 5 shows an example of a portion of a multi-material hard mask, according to embodiments. In this example, hard mask 520 is made up of four different materials: Material A, Material B, Material A' and Material B'. Hard mask 520 is made up of two vertical layers, lower layer 522 and upper layer 524. Lower layer 522 of hard mask 520 includes alternating strips of Material A and Material B. Upper layer 524 of hard mask 520 includes alternating strips of Material A' and Material B'. Using a multi-material hard mask as shown in FIG. 5, greater freedom is provided in designing features to be patterned into the underlying substrate or layer 510.

Figure 6:
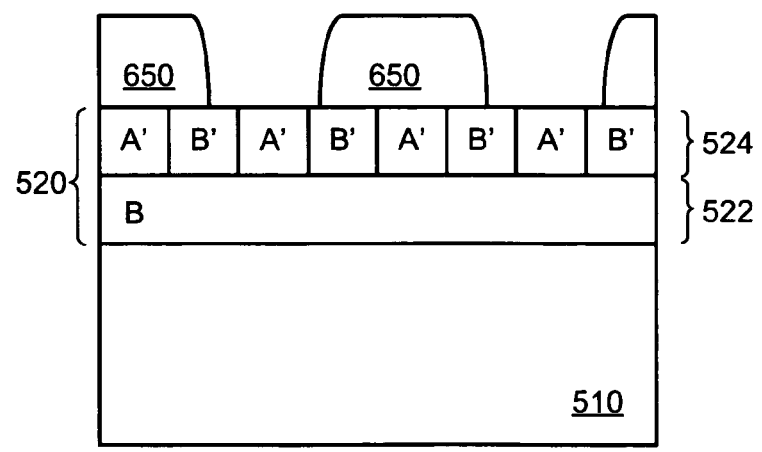
FIG. 6 is a cross section of the hard mask and underlying substrate shown in FIG. 5.

FIG. 6 is a cross section of the hard mask and underlying substrate or layer shown in FIG. 5. In FIG. 6, a resist layer 650 has been coated then exposed and developed to uncover selected regions of Material A' which will be selectively removed by etching. The etching process is carried out such that Material A' is removed but Material A, Material B and Material B' are not removed. In a process analogous to that shown and described with respect to FIGS. 2a-2f, but using four iterations of resist coating, exposure, resist development and selective etching, hard mask 520 is patterned.

Figure 7A:
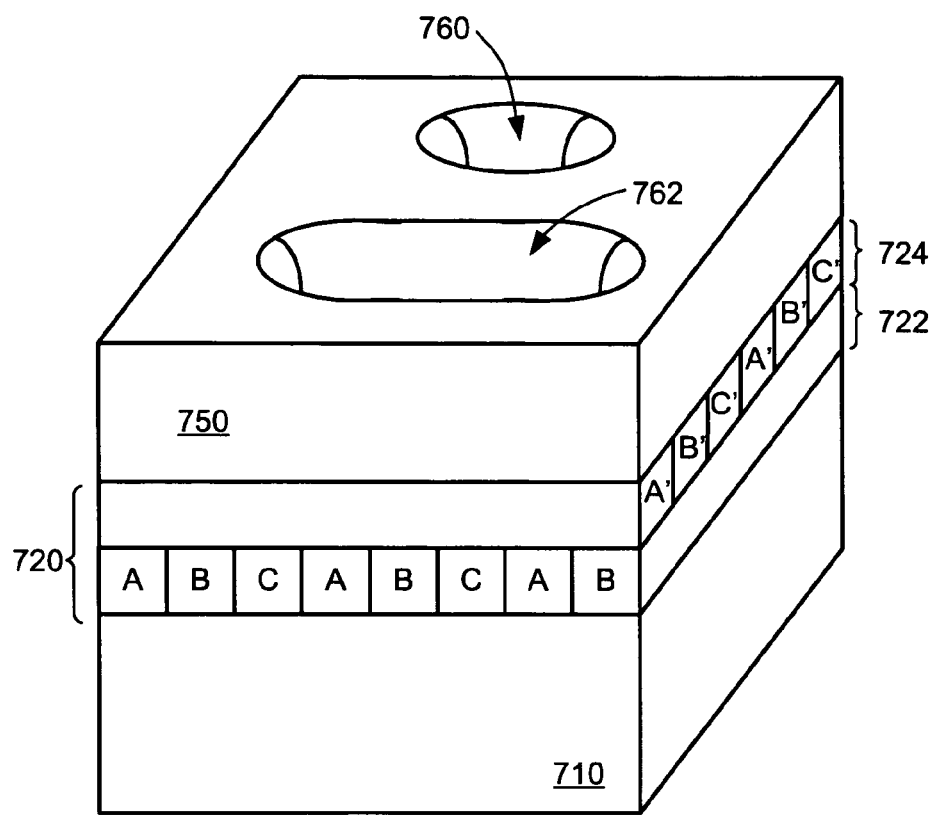
FIGS. 7*a*-7*b* shows another example of a multi-material hard mask, according to embodiments.
Figure 7B:
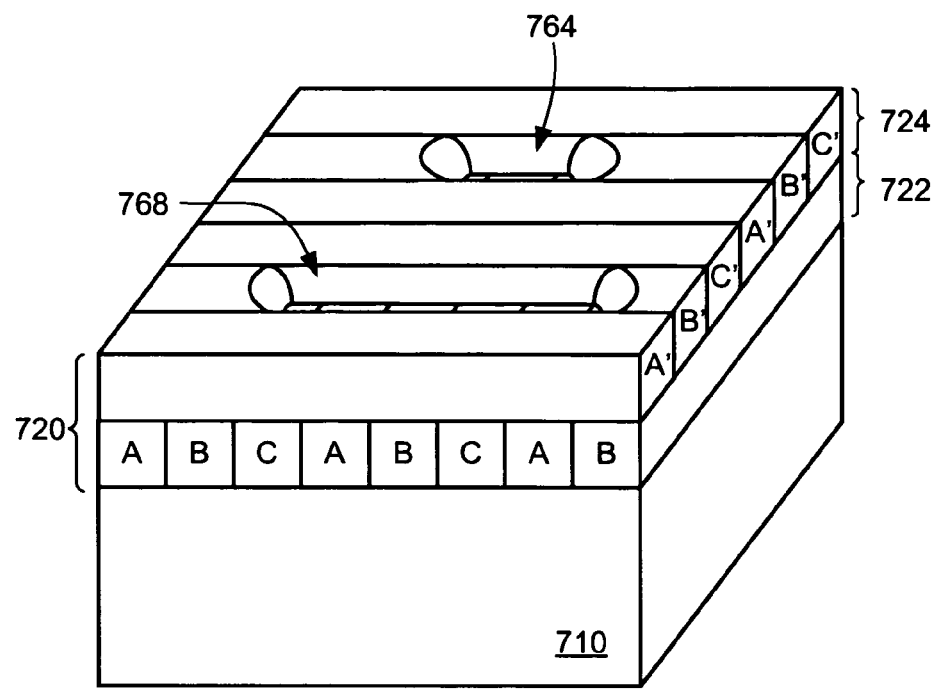

FIGS. 7a-7b show another example of a multi-material hard mask, according to embodiments. As shown in FIG. 7a, in this example, hard mask 720 is made up of six different materials: Material A, Material B, Material C, Material A', Material B' and Material C'. Hard mask 720 is made up of two vertical layers, lower layer 722 and upper layer 724. Lower layer 722 of hard mask 720 includes periodic strips of Material A, Material B and Material C. Upper layer 724 of hard mask 720 includes periodic strips of Material A', Material B' and Material C'. Also shown in FIG. 7 is a photoresist layer 750 that has been coated then exposed and developed to create openings 760 and 762, which uncover selected areas of Material B' in upper layer 724 of hard mask 720.

In FIG. 7b, the selective etching of Material B' has been carried out to remove Material B' from regions 764 and 768, but leaving the other materials of hard mask 720 intact. Photoresist layer 750 has also been removed. Note that selected portions of lower layer 722 of hard mask 720 are now exposed due to the removal of Material B' from regions 764 and 768. Following the state shown in FIG. 7b could include applications of a new photoresist layer and then possibly selective removal of one or more of the other materials A, B, C, A' or C', as has been described herein.

Figure 8A:
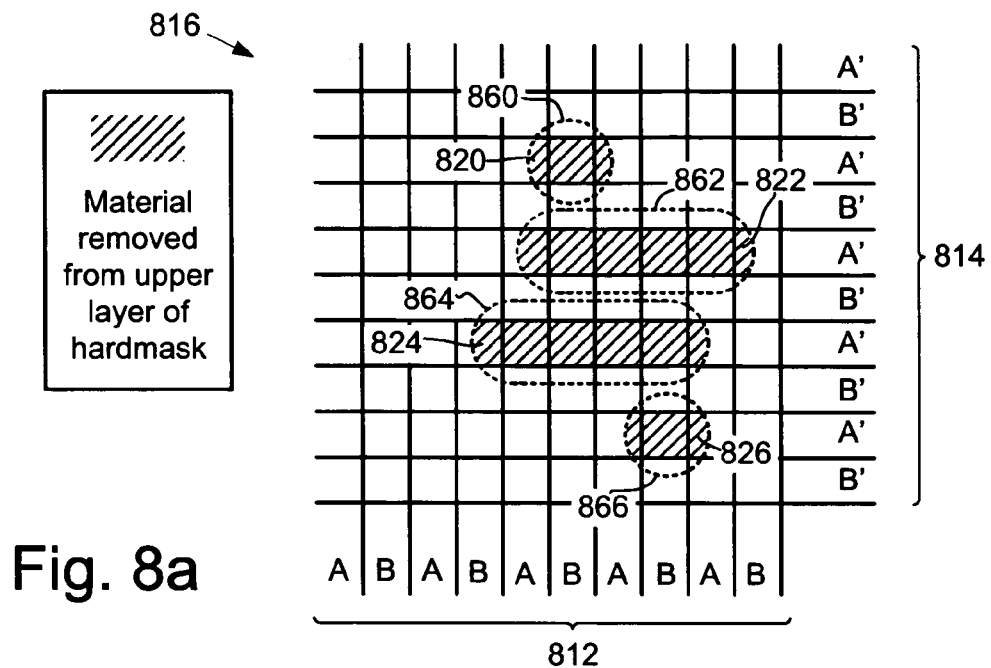
FIGS. 8*a*-8*d* show steps involved in patterning a two-layer multi-material hard mask, according to embodiments.

FIGS. 8a-8d show steps involved in patterning a two-layer multi-material hard mask, according to embodiments. FIGS. 8a-8d are plan views of a two-layer multi-material hard mask 816 that is overlying a semiconductor substrate or other device layer to be patterned using hard mask 816. Hard mask 816 includes and upper layer 814 having alternating strips of Material A' and Material B', and lower layer 812 having alternating strips of Material A and Material B. In FIG. 8a, a photoresist layer is provided over mask 816 and is exposed and developed to uncover areas 860, 862, 864 and 866 of upper layer 814 of mask 816. As can be seen, selected portions of Material A' are exposed for processing, along with certain adjacent portions of Material B'. A selective etching is carried out that removes Material A' from the areas not protected by photoresist, but leaves the other hard mask materials A, B and B' intact. As a result of the selective etching, areas of Material A' 820, 822, 824 and 826 are removed.

Figure 8B:
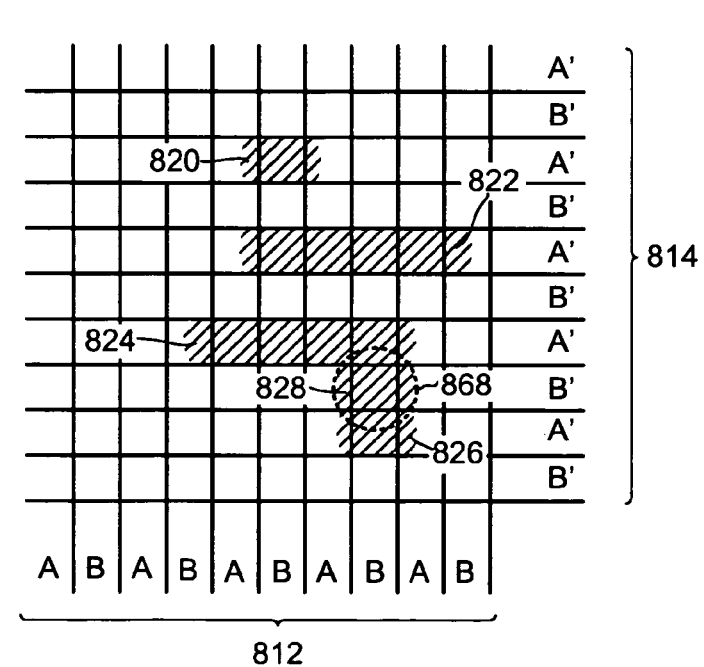

In FIG. 8b, a new photoresist layer is provided over mask 816 and is exposed and developed to uncover area 868 of upper layer 814 of mask 816. As can be seen, a selected portion of Material B' is exposed for processing. A selective etching is carried out that removes Material B' from the area 868 not protected by photoresist, but leaves the other hard mask materials A, B and B' intact. As a result of the selective etching, area of Material A' 828 is removed.

Figure 8C:
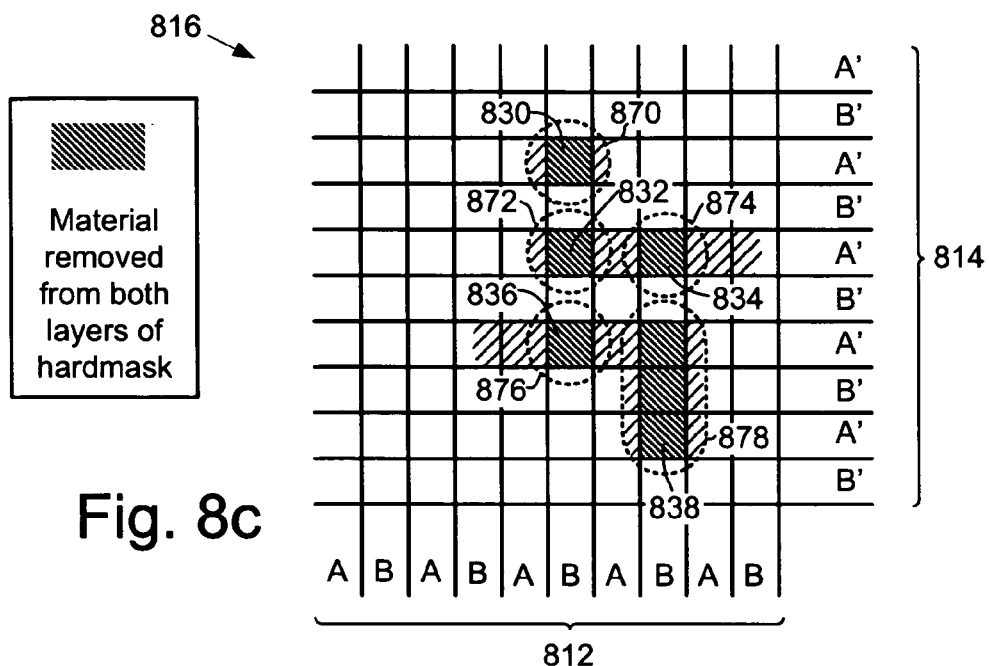

In FIG. 8c, a new photoresist layer is provided over mask 816 and is exposed and developed to uncover areas 870, 872, 874, 876 and 878 of mask 816. As can be seen, selected portions of Material B are exposed for processing, along with certain adjacent portions of Materials A and B'. A selective etching is carried out that removes Material B from the areas not protected by photoresist, but leaves the other hard mask materials A, A' and B' intact. As a result of the selective etching, areas of Material B 830, 832, 834, 836 and 838 are removed.

Figure 8D:
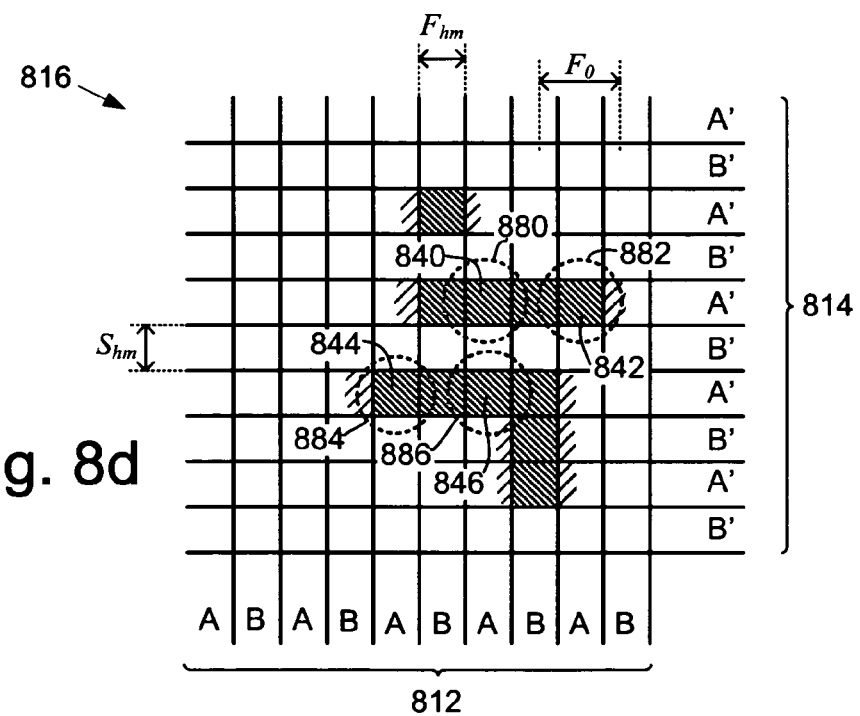

In FIG. 8d, a new photoresist layer is provided over mask 816 and is exposed and developed to uncover areas 880, 882, 884 and 886 of mask 816. As can be seen, selected portions of Material A are exposed for processing, along with certain adjacent portions of Materials B and B'. A selective etching is carried out that removes Material A from the areas not protected by photoresist, but leaves the other hard mask materials B, A' and B' intact. As a result of the selective etching, areas of Material A 840, 842, 844 and 846 are removed. Thus through the steps shown and described, hard mask 816 has been patterned to created precise openings as shown by the dark cross hatching in FIG. 8d. As describe above, the substrate or other layer underlying hard mask 816 can now be etched or otherwise processed according to the design of the device being manufactured.

Note that in FIG. 8d, it can be seen that the feature size $F_{hm}$ is significantly smaller than the resolution $F_0$ of conventional resist exposure and development processes. Additionally, it can be seen that the spacing distance between features $S_{hm}$ is smaller than would have been possible with a resolution $F_0$.

Figure 9:
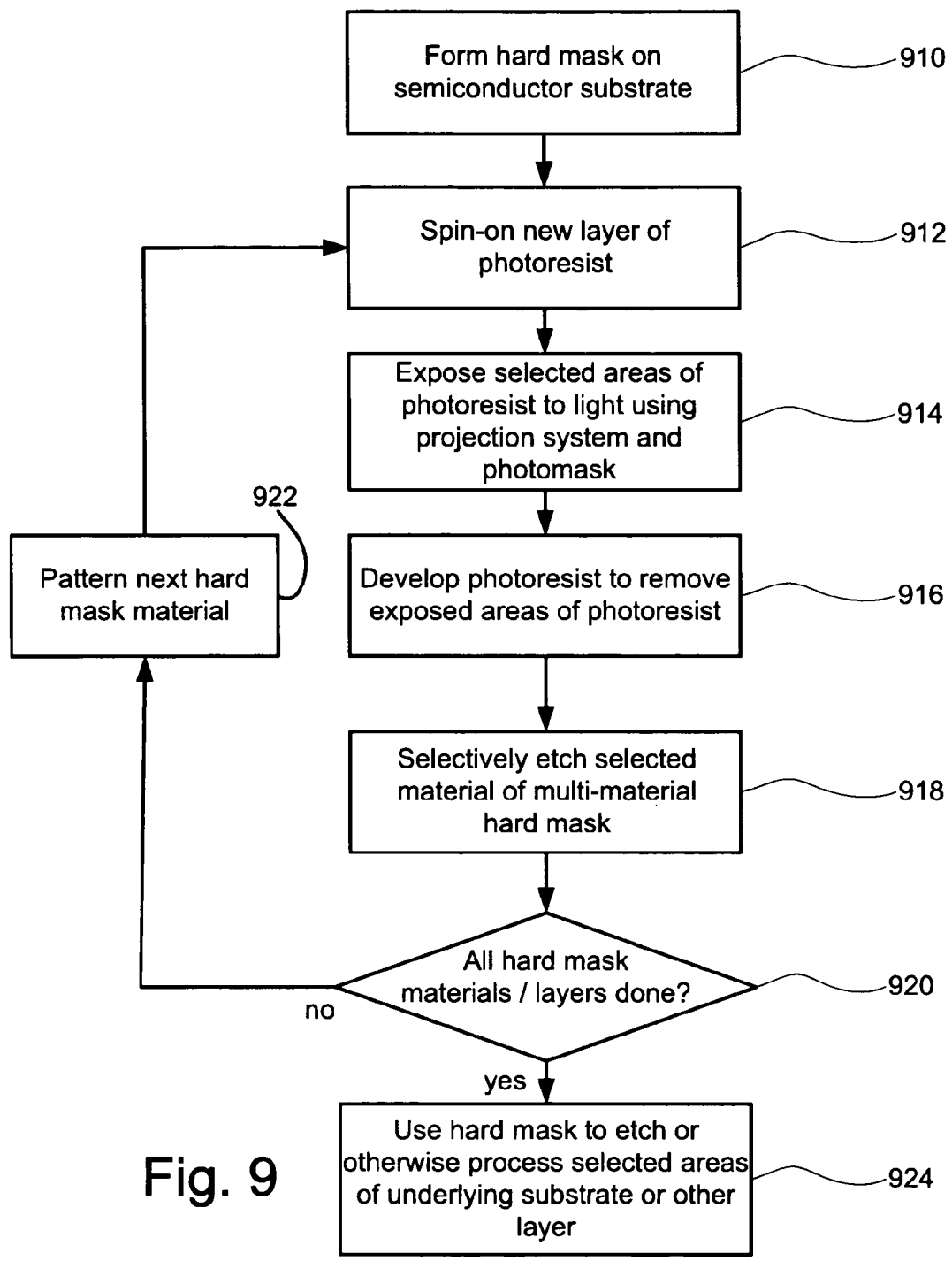
FIG. 9 is a flow chart showing steps of creating a hard mask and patterning an integrated circuit using the same, according to embodiments.

FIG. 9 is a flow chart showing steps of creating a hard mask and patterning an integrated device using the same, according to embodiments. In step 910, the hard mask layer is formed on a substrate of semiconductor or other materials. The hard mask can have multiple vertical layers as described herein. The process for forming the hard mask can be as shown and described with respect to FIGS. 10a-10e. Also as described, the hard mask can be formed on other layers besides a substrate, according to the particular design of device. In step 912, a layer of photoresist is applied above the hard mask. In step 914, a photomask and projection system is used to expose selected areas of the photoresist to light. In step 916 the photoresist is developed to remove the exposed areas of photoresist (or to remove the unexposed areas of photoresist, depending upon whether the photoresist is negative or positive), thereby exposing certain portions of the hard mask. In step 918, the hard mask is selectively etched to remove the target material of the hard mask. In step 920, a check is made to determine if there are further target material-types and/or further layers of the hard mask to remove. If so, in step 922 the process is looped back to step 912 for the next target material and/or layer of the hard mask. When all the hard mask material and layers have been removed according to the desired design of device, in step 924, the hard mask pattern is transferred to the underlying substrate or other layer.

According to certain embodiments, the same or similar materials can be used in the different vertical layers of a multi-layer hard mask. For instance, in the example shown in FIGS. 8a-8d, it can be true that Material A=Material A' and Material B=Material B'. The timing of the etching process needs to be controlled more carefully than in the case when all of the materials are different (such that the lower layer acts as an etch stop layer when selectively etching the upper layer). According to one embodiment where A=A' and B=B', etching is halted in the upper layer when approximately 10% of the lower layer has been removed, thus ensuring the complete removal of the selected material from the upper layer of the hard mask.

Figure 10A:
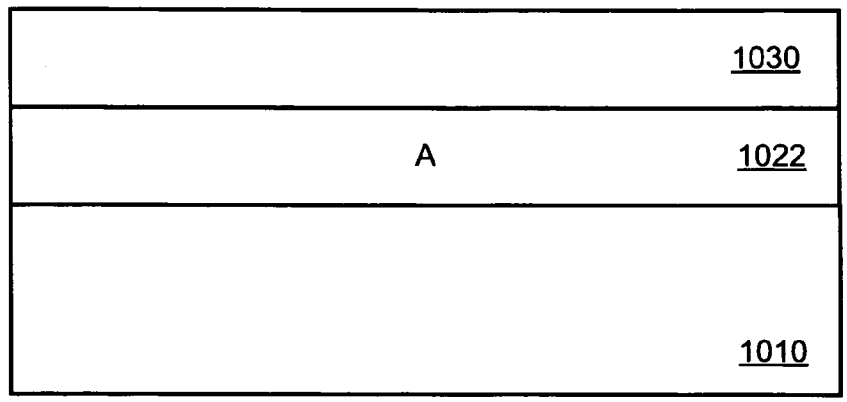
FIGS. 10a-10e illustrate steps in fabricating a suitable hard mask.
Figure 10B:
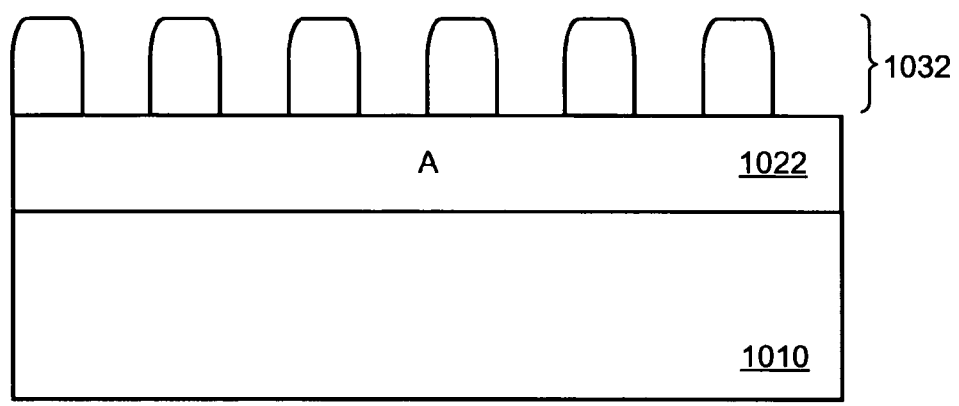

FIGS. 10a-10e illustrate steps in fabricating a suitable hard mask. FIGS. 10a-10e are cross-sectional views of a semiconductor substrate 1010 on which the hard mask will be formed. In FIG. 10a, a layer of Material A 1022 is deposited on substrate 1010 and a layer of photoresist 1030 is applied thereon. In FIG. 10b, the photoresist layer is patterned into a series of uniform parallel strips 1032 on top of Material A layer 1022. According to embodiments, "interferometric lithography" techniques are used since these techniques are known for the ability to form fine grating patterns. For example, the techniques described in the following could be used: A. K. Raub, et al., "Deep-UV Immersion Interferometric Lithography," Proc. SPIE, vol. 5377, pp. 306-318, 2004; E. Hendrickx, et al., "Early Learning on Hyper-NA Lithography Using Two-Beam Immersion Interference," Proc. SPIE, vol. 6154, pp. 61541X-1 to 61541X-11, 2006; and Y. Fan, et al., "Effects of beam pointing instability on two-beam interferometric lithography," Proc. SPIE, vol. 6154, pp. 61542L-1 to 61542L-12, 2006; each of which is incorporated by reference herein. These maskless interferometric lithography techniques can use visible light, ultraviolet (UV), DUV such as 193 nm and 157 nm, extreme ultraviolet (EUV), and electron beam, etc., as energy sources. For interferometric lithography using visible, UV, and DUV light, overdosed exposure may be employed to form thin lines or small spots around minimum intensity points, which have a width or diameter that is smaller than λ/4, then multiple exposure and patterning steps may be employed to interleave patterns so to create a desired periodic hard mask. According to further embodiments, other techniques can be used for preparing the hard masks as described herein, including: 1) lithographic processes using EUV or electron beam with a periodic mask; and 2) "imprint lithography", also known as "nanoimprint lithography", with a periodic mold. For further details on imprint or nanoimprint lithography techniques, see for example, S. Y. Chou, P. R. Krauss, and P. J. Renstrom, "Nanoimprint lithography," J. Vac. Sci. Technol. B, vol. 14, no. 6, pp. 4129-4133, November/December 1996; and D. J. Resnick, et al., "Imprint lithography for integrated circuit fabrication," J. Vac. Sci. Technol. B, vol. 21, no. 6, pp. 2624-2631, November/December 2003; each of which is incorporated by reference herein. Overlay and other patterning errors that exist during the preparation of periodic hard masks, can be better controlled due to the regularity and periodicity of the structure, and the remaining errors eventually lead to global and deterministically correlated changes of linewidths and spacings in fabricated chips, whose effects may be compensated or canceled by proper circuit design considerations.

Figure 10C:
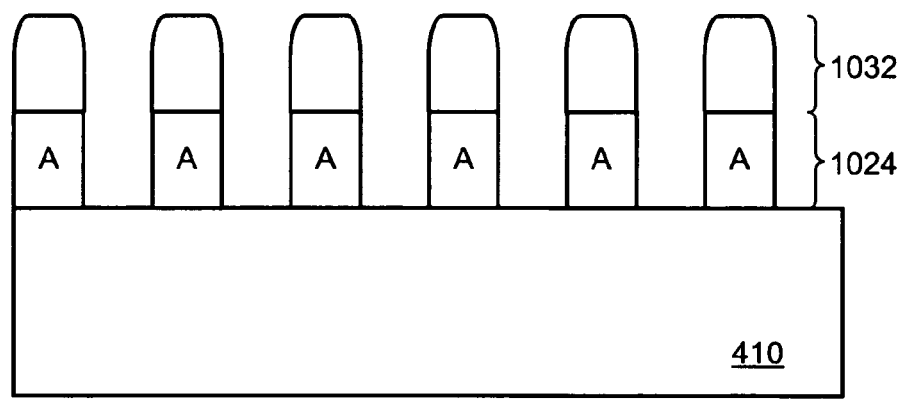
Figure 10D:
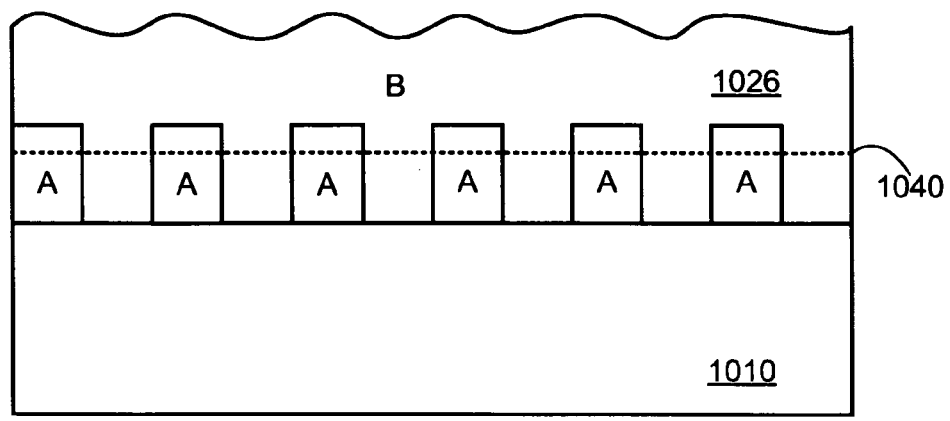
Figure 10E:
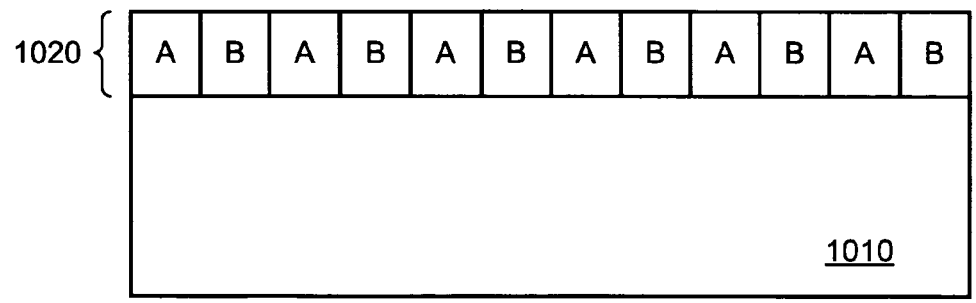

In FIG. 10c, a wet or dry (plasma) etching or ion milling process is carried out to transfer the grating pattern onto the layer of Material A, thereby forming strips of Material A 1024 as shown, then the photoresist material is removed. In FIG. 10d, a layer 1026 of Material B is deposited, then a CMP process is carried out to remove all material above line 1040 and have the surface polished. FIG. 10e shows the resulting structure with hard mask 1020 formed on top of substrate 1010. When forming a hard mask with two vertical layers, such as shown and described with respect to FIGS. 5-8, the process shown in FIGS. 10a-10e is repeated at a 90 degree offset, using the same materials A and B, or different materials A' and B' as has been described.

There are many known examples of materials and associated etching processes that can be used for the hard mask techniques described herein. Wet etching processes, generally speaking, are more material-selective since they rely primarily on chemical reactions for material removal. Examples of wet etching processes are: 1) HF (49% in water) etches $SiO_2$ selectively, over Si; 2) $H_3PO_4:H_2O:HNO_3$: $CH_3COOH$ (16:2:1:1) etches Al selectively, over Si, $SiO_2$, and photoresist. Plasma (dry) etching processes can also be used. For example, plasma of HBr, or $Cl_2$, or $Cl_2/HBr/O_2$ etches polysilicon or single-crystal Si selectively, over $SiO_2$. See for example, J. D. Plummer, M. D. Deal, and P. B. Griffin, Silicon VLSI Technology: Fundamentals, Practice, and Modeling, page 618 and page 645, Prentice Hall, Upper Saddle River, N.J., USA, July, 2000, for wet and plasma etching techniques, incorporated herein by reference.

Figures 11, 12:
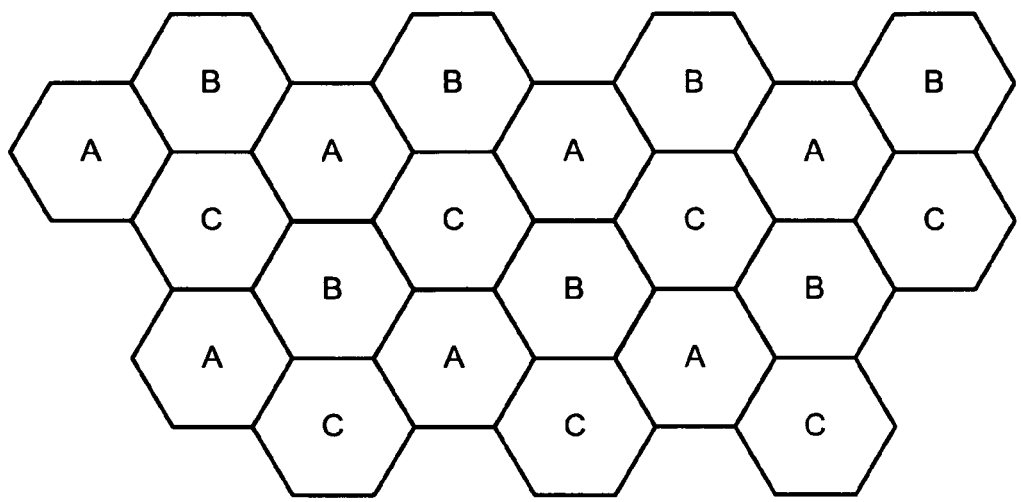

FIGS. 11-14 are plan views illustrating arrangements of multiple materials of a hard mask on a single vertical layer that is substantially parallel to the underlying device layer, according to alternative embodiments. In FIG. 11, three different materials labeled A, B and C are arranged in a "honeycomb" pattern on a triangular lattice as shown. In FIG. 12, a two-dimensional regular alternating pattern like a "checkerboard" is provided with two materials labeled A and B. In FIGS. 13 and 14 four materials labeled A, B, C and D are used to form two-dimensional regular alternating patterns. The difference between FIGS. 13 and 14 lies in the x-y symmetry of periodicity. While FIG. 14 repeats a perfect square unit cell $$\begin{bmatrix} A & B \\ C & D \end{bmatrix},$$

FIG. 13 has a non-square unit cell $$\begin{bmatrix} A & B & C & D \\ C & D & A & B \end{bmatrix}.$$

In the pattern shown in FIG. 13, portions of the same material are separated farther along the x direction than the y direction. Depending on specific considerations, either configuration may become better preferred than the other. The above-described arrangements of multiple different materials into regular two-dimensional patterns on a single-layer hard mask have the advantages of reducing the number of vertical layers (e.g., down to just one) for the hard mask, and reducing the number of resist exposures and developments needed to pattern the hard mask. For example, using a hard mask as shown in FIG. 12, where a single layer of hard mask consisting of two materials A and B arranged into a two-dimensional periodic pattern, just two resist exposures and developments, one for etching and removing material A portions, the other for material B portions, is sufficient to create complex two-dimensional patterns on the single-layer hard mask. When forming a hard mask having a two-dimensional multi-material periodic pattern on a single vertical layer, such as shown and described with respect to FIG. 12, a similar process as shown in FIGS. 10a-10e is carried out, albeit the photoresist layer is exposed and developed to form a two-dimensional periodic pattern of "islands" on top of the Material A layer, then the photoresist pattern is transferred into the hard mask to form a two-dimensional periodic pattern of Material A islands with gaps in between, then the photoresist is removed and a Material B layer is deposited to fill the gaps between Material A islands, then a CMP process is carried out to define a flat and polished surface manifesting the periodic pattern of alternating portions of Material A and Material B as shown in FIG. 12, while the vertical thickness of the resulted hard mask is at a desired value.

According to an alternative embodiment, a multi-material prepatterned layer is used instead of a hard mask layer. The prepatterned layer is formed in a pattern with multiple materials as described elsewhere herein. However, according to this embodiment, a substantial portion of at least one of the materials used for the prepatterned layer is not later removed (i.e., it is not sacrificial), but rather remains to form at least part of a structure of the device being fabricated. In one example, a technique such as shown and described with respect to FIGS. 10a-10e is used to form a two-material prepatterned layer consisting of alternating parallel strips of Material A and Material B respectively overlying a SiO₂ or high-k dielectric layer on a semiconductor substrate as shown in FIG. 1, where Material A is a metal composition or polysilicon that is suitable to form gates of complementary metal-oxide-semiconductor (CMOS) transistors, while Material B is another conductor that is chemically different from Material A but forms an ohmic contact with Material A. A first sequence of lithography steps of photoresist exposure, development, and pattern transfer such as shown and described with respect to FIGS. 2a-2e is carried out to remove selected portions of Material A. The photoresist is then removed and a second sequence of lithography steps is carried out to remove selected portions of Material B, and leave selected portions of Material B to connect two remaining Material A strips. For more details on the use of high-k dielectric and metal gate materials for CMOS transistors, see for example, M. T. Bohr, R. S. Chau, T. Ghani, and K. Mistry, "The High-k Solution," *IEEE Spectrum*, vol. 44, no. 10, pp. 29-35, October 2007, which is incorporated by reference herein. It is noted that, although not explicitly shown in the cross-sectional views of FIGS. 2a-2e, in each sequence of lithography steps of photoresist exposure, development, and pattern transfer, the optical images formed in the photoresist layer are two-dimensional in general, so are the developed resist patterns and the patterns transferred into the prepatterned layer, thus each individual strip of Material A or B may be segmented into separate bars, and collections of such prepatterned layer bars of Material A and B constitute complex two-dimensional patterns. Portions of the prepatterned layer constituting the complex two-dimensional patterns are not removed later. Rather, they remain to become the gate layer of the device being fabricated. Such prepatterned-layer-turned gate layer has a smaller pitch and higher CD uniformity in the material-AB-alternating direction than the other direction, and can be rightly suitable to fabricate devices that are designed to have relaxed requirements of resolution and CD uniformity in one direction than the other. In another example, a prepatterned layer consisting of portions of Material A and Material B, both metallic conductors, alternating periodically in two dimensions as shown in FIG. 12, is used. Upon the completion of two sequences of lithography steps of photoresist exposure, development, and pattern transfer, portions of Material A and B may have been removed, but there are remaining portions of Material A and B constituting complex two-dimensional patterns, which are not removed later, but stay in place and form a metal interconnect layer for the device being fabricated.

The multi-exposure multi-patterning techniques described herein do not incur the problem of pattern splitting conflict, and are able to substantially relax the requirements of overlay and CD control, when exposing and developing the photoresists on hard masks, and transferring photoresist patterns onto hard masks or prepatterned layers. The multi-exposure multi-patterning techniques described herein are rather effective in reducing the $k_1$ factor. And the factor by which the $k_1$ factor is reduced can be increased further by using a hard mask or prepatterned layer with more chemically different materials, thus a longer period of material-alternation for the regular patterns on the hard mask or prepatterned layer. For example, double patterning techniques using a one-layer two-material hard mask or prepatterned layer (such as shown and described with respect to FIGS. 1 and 2) are quite suitable for fabricating memory chips with repeated regular structures and consisting mostly of lines along one direction, while multiple patterning techniques using hard masks or prepatterned layers consisting of two-dimensional regular patterns (such as shown and described with respect to FIGS. 11-14) are quite suitable for patterning contact or via layers.

The multi-exposure multi-patterning techniques described herein are suitable for microfabricating devices, especially integrated devices, including but not limited to, CMOS integrated circuits, bipolar integrated circuits, integrated circuits having mixed metal-oxide-semiconductor and bipolar transistors, digital integrated circuits, analog integrated circuits, radio-frequency or microwave integrated circuits, integrated circuits having mixed digital, analog, and radio-frequency or microwave devices, microelectromechanical systems (MEMS), nanoelectromechanical systems (NEMS), nanometer scale integrated circuits and systems, quantum mechanical devices, integrated photonic devices, integrated circuits having optoelectronic devices, integrated circuits having plasmonic and/or polaritonic devices, optical or X-ray or electron wave diffractors or filters or gratings or holograms, electromagnetic metamaterials, integrated systems having chemically or biologically functioning devices, patterned magnetic devices for data storage and/or logic functions, and patterned ferroelectric devices for data storage and/or logic functions, etc. Furthermore, the multi-exposure multi-patterning techniques are suitable to microfabricate devices that are used in microfabricating other devices, including but not limited to, photomasks for photolithography using light in the visible, UV, DUV, and EUV spectral range, masks for X-ray or electron beam or ion beam or atomic beam or molecular beam lithography, and molds or templates for imprint or nanoimprint lithography. For further details on applications of imprint or nanoimprint lithography in fabricating complex devices like CMOS integrated circuits, in particular the required molds or templates, see for example, D. J. Resnick, et al., "High Resolution Templates for Step and Flash Imprint Lithography," *Proc. SPIE*, vol. 4688, pp. 205-213, 2002; and M. Melliar-Smith, "Lithography Beyond 32 nm—A Role for Imprint?" in *Proceedings of SPIE on CD-ROM, Advanced Microlithography* 2007, Plenary Paper: MLPLENARY.pdf, SPIE, 2007; each of which is incorporated by reference herein.

It is noted, as well known in the art, that the application of photoresist on an underlying layer or substrate, such as a hard mask or a prepatterned layer or a device layer, does not always coat just a single layer of photoresist directly on the underlying layer or substrate. Rather, a stack of films, referred to as a photoresist film stack, may be provided, which often includes a bottom antireflection coating (BARC), a photoresist layer, possibly a top antireflection coating (TARC), even a contrast enhancement layer and other auxiliary layers (See for example, C. Mack, *Fundamental Principles of Optical Lithography: The Science of Microfabrication*, Chapter 4, "Imaging in Resist: Standing Waves and Swing Curves," pp. 129-190, Wiley, January 2008). A BARC layer is provided between the photoresist and the underlying layer or substrate to reduce the reflection of light from the underlying layer or substrate back into the photoresist. A TARC layer is provided on top of the photoresist to suppress the reflection of light from the interface between the resist and the air or vacuum or an immersion medium into the resist, as well as reduce the reflection of light from the same interface to the projection lens. When an immersion medium, usually water, exists between the projection lens and the photoresist, the TARC layer also protects the photoresist from degradation due to direct contact with the immersion medium. Accordingly, as used herein, phrases such as "photoresist film", "layer of photoresist", "photoresist layer", and "resist layer" refer to either a single layer or multiple layer photoresist film stack consisting of at least one layer of a photosensitive material. Indeed, in many cases as used herein the term "photoresist" or "resist" stands for generally a photoresist film stack including other auxiliary layers than a single photosensitive layer. Similarly, a hard mask or prepatterned layer as described herein does not always directly overlie a device layer or substrate to be patterned. Rather, there may be a sacrificial etch-stop layer deposited between the hard mask or prepatterned layer and the device layer or substrate to be patterned, in which case the "underlying layer" beneath the hard mask or prepatterned layer, as described herein, refers to the combined structure of the sacrificial etch-stop layer and the device layer or substrate to be patterned, albeit the sacrificial etch-stop layer, or at least a portion of it, needs to be removed after the device layer or substrate being successfully patterned according to the design of the device being microfabricated.

Whereas many alterations and modifications of the present invention will no doubt become apparent to a person of ordinary skill in the art after having read the descriptions herein, it is to be understood that the particular preferred embodiments shown and described by way of illustration are in no way intended to be considered limiting. Therefore, reference to the details of the preferred and other embodiments are not intended to limit their scope, which is limited only by the scope of the claims set forth below.

What is claimed is:

1. A method of microfabricating devices comprising:
   forming a hard mask on an underlying device layer to be patterned, the hard mask including at least a first material and a second material, the first and second materials having substantially different chemical properties;
   in a first etching process, etching portions of the first material of the hard mask, the first etching process being selective to etch the first material over the second material;
   in a second etching process, etching portions of the second material of the hard mask, the second etching process being selective to etch the second material over the first material, the first and second etching processes forming a pattern in the hard mask; and
   transferring the pattern in the hard mask to the underlying layer;
   wherein the underlying device layer is in direct contact with the first material and the second material.

2. A method of microfabricating devices according to claim 1
   wherein the devices are integrated circuits.

3. A method of microfabricating devices comprising:
   forming a hard mask on an underlying device layer to be patterned, the hard mask including at least a first material and a second material, the first and second materials having substantially different chemical properties;
   in a first etching process, etching portions of the first material of the hard mask, the first etching process being selective to etch the first material over the second material;
   in a second etching process, etching portions of the second material of the hard mask, the second etching process being selective to etch the second material over the first material, the first and second etching processes forming a pattern in the hard mask; and
   transferring the pattern in the hard mask to the underlying layer;
   wherein the hard mask includes a plurality of interfaces between the first material and the second material, the interfaces being substantially perpendicular to the underlying layer.

4. A method according to claim 3 wherein the first and second materials of the hard mask are arranged in a periodic pattern in which the interfaces are substantially parallel to each other in a first direction.

5. A method according to claim 4 wherein the first and second materials and the interfaces thereof form part of a first layer of the hard mask being substantially parallel to the underlying layer, and the hard mask including a second layer having material interfaces that are substantially parallel to each other and substantially different from the first direction.

6. A method according to claim 5 wherein the second layer of the hard mask includes the first and second materials.

7. A method according to claim 5 wherein the second layer of the hard mask includes a third material and a fourth material, each of the first, second, third and fourth materials having substantially different chemical properties.

8. A method of microfabricating devices comprising:
forming a hard mask on an underlying device layer to be patterned, the hard mask including at least a first material and a second material, the first and second materials having substantially different chemical properties;
in a first etching process, etching portions of the first material of the hard mask, the first etching process being selective to etch the first material over the second material;
in a second etching process, etching portions of the second material of the hard mask, the second etching process being selective to etch the second material over the first material, the first and second etching processes forming a pattern in the hard mask; and
transferring the pattern in the hard mask to the underlying layer; further comprising:
forming a first layer of photoresist on the hard mask, the first layer of photoresist being in direct contact with first material and the second material;
exposing the first layer of photoresist to light using a first photomask;
removing material from the first photoresist layer corresponding to the exposure of the first layer of photoresist, thereby uncovering certain areas of the hard mask in preparation for the first etching process;
removing the first layer of photoresist after the first etching process;
forming a second layer of photoresist on the hard mask after the removal of the first layer of photoresist, the second layer of photoresist being in direct contact with first material and the second material;
exposing the second layer of photoresist to light using a second photomask; and
removing material from the second photoresist layer corresponding to the exposure of the second layer of photoresist, thereby uncovering certain areas of the hard mask in preparation for the second etching process.

9. A method of microfabricating devices comprising:
forming a hard mask on an underlying device layer to be patterned, the hard mask including at least a first material and a second material, the first and second materials having substantially different chemical properties;
in a first etching process, etching portions of the first material of the hard mask, the first etching process being selective to etch the first material over the second material;
in a second etching process, etching portions of the second material of the hard mask, the second etching process being selective to etch the second material over the first material, the first and second etching processes forming a pattern in the hard mask; and
transferring the pattern in the hard mask to the underlying layer;
wherein the hard mask includes a third material and a fourth material.

10. A method according to claim 9 wherein the hard mask includes a plurality of interfaces between the third material and the fourth material, the interfaces being substantially perpendicular to the underlying layer.

11. A method of microfabricating devices comprising:
forming a hard mask on an underlying device layer to be patterned, the hard mask including at least a first material and a second material, the first and second materials having substantially different chemical properties;
in a first etching process, etching portions of the first material of the hard mask, the first etching process being selective to etch the first material over the second material;
in a second etching process, etching portions of the second material of the hard mask, the second etching process being selective to etch the second material over the first material, the first and second etching processes forming a pattern in the hard mask; and
transferring the pattern in the hard mask to the underlying layer;
wherein the first and second etching processes are wet etching processes.

12. A method of microfabricating devices comprising:
forming a hard mask on an underlying device layer to be patterned, the hard mask including at least a first material and a second material, the first and second materials having substantially different chemical properties;
in a first etching process, etching portions of the first material of the hard mask, the first etching process being selective to etch the first material over the second material;
in a second etching process, etching portions of the second material of the hard mask, the second etching process being selective to etch the second material over the first material, the first and second etching processes forming a pattern in the hard mask; and
transferring the pattern in the hard mask to the underlying layer;
wherein the first and second materials are selected from the group consisting of: single-crystal silicon, polysilicon, amorphous silicon, silicon dioxide, silicon nitride, aluminum, copper, glass, metallic alloys, and III-V semiconductors, biological materials, and quantum mechanical function materials.

13. A method according to claim 12 wherein the first material is primarily silicon dioxide and the first etching process is a wet etching process based at least in part on hydrofluoric acid.

14. A method according to claim 12 wherein the first material is primarily aluminum and the first etching process is a wet etching process based at least in part on phosphoric acid.

15. A method according to claim 12 wherein the hard mask is formed in part by using an interferometric lithography technique.

16. A method of microfabricating devices comprising:
forming a hard mask on an underlying device layer to be patterned, the hard mask including at least a first material and a second material, the first and second materials having substantially different chemical properties;
in a first etching process, etching portions of the first material of the hard mask, the first etching process being selective to etch the first material over the second material;
in a second etching process, etching portions of the second material of the hard mask, the second etching process being selective to etch the second material over the first material, the first and second etching processes forming a pattern in the hard mask; and
transferring the pattern in the hard mask to the underlying layer;
wherein a projection system and a photomask are used to generate a first pattern in a photoresist layer in preparation for the first etching process, and the pattern transferred to the underlying layer has a minimum feature size substantially less than a minimum feature size of the first pattern in the photoresist resulting from the projection system and photomask.

17. A method of microfabricating devices comprising:
forming a hard mask on an underlying device layer to be patterned, the hard mask including at least a first material and a second material, the first and second materials having substantially different chemical properties;
in a first etching process, etching portions of the first material of the hard mask, the first etching process being selective to etch the first material over the second material;
in a second etching process, etching portions of the second material of the hard mask, the second etching process being selective to etch the second material over the first material, the first and second etching processes forming a pattern in the hard mask; and
transferring the pattern in the hard mask to the underlying layer;
wherein the hard mask includes a plurality of interfaces between the first material and the second material, the interfaces being substantially perpendicular to the underlying device layer, the first and second materials of the hard mask being arranged in a two-dimensional regular pattern, in which a first set of the interfaces are substantially parallel to each other in a first direction, and a second set of the interfaces are substantially parallel to each other in a second direction.

18. A method according to claim 17 wherein the first and second direction are substantially perpendicular to each other.

19. A method of fabricating a multi-material hard mask for use in the microfabrication of devices comprising: forming a layer of a first material on a device layer to be patterned; patterning the layer of first material into a regular pattern of alternating portions of first material and gaps between the first material; and depositing a layer of a second material into the gaps between the first material, wherein the first and second material have substantially different chemical properties; further comprising polishing the resulting combination of first and second material portions to create a substantially planar upper surface of the hard mask; and further comprising forming an upper layer of the hard mask having a second regular pattern of alternating portions of different materials which is offset from the regular pattern of the underlying hard mask layer by approximately 90 degrees.

20. A method of fabricating a multi-material hard mask for use in the microfabrication of devices comprising: forming a layer of a first material on a device layer to be patterned; patterning the layer of first material into a regular pattern of alternating portions of first material and gaps between the first material; and depositing a layer of a second material into the gaps between the first material, wherein the first and second material have substantially different chemical properties; wherein the hard mask includes a plurality of interfaces between the first material and the second material, the interfaces being substantially perpendicular to the underlying device layer, the first and second materials of the hard mask being arranged into a two-dimensional regular pattern, in which a first set of the interfaces are substantially parallel to each other in a first direction, and a second set of the interfaces are substantially parallel to each other in a second direction.

21. A method according to claim 20 wherein the first and second direction are substantially perpendicular to each other.

22. A microfabricated device manufactured using a process comprising:
forming a hard mask on an underlying device layer to be patterned, the hard mask including alternating portions of a first material and a second material, the first and second materials having substantially different chemical properties;
in a first etching process using a projection system and a first photomask, etching portions of the first material of the hard mask, the first etching process being selective to etch the first material over the second material;
in a second etching process, etching portions of the second material of the hard mask, the second etching process being selective to etch the second material over the first material, the first and second etching processes forming a pattern in the hard mask; and
transferring the pattern in the hard mask to the underlying layer, wherein the integrated circuit has a minimum feature size corresponding to the size of the alternating portions of first and second material, the minimum feature size being substantially less than a minimum feature size resulting from the projection system and first photomask.

23. A microfabricated device according to claim 22 wherein the hard mask includes a plurality of interfaces between the first material and the second material, the interfaces being primarily perpendicular to the underlying layer.

24. A microfabricated device according to claim 23 wherein the alternating portions of first and second material of the hard mask are arranged in a periodic pattern in which the interfaces are substantially parallel to each other in first direction.

25. A microfabricated device according to claim 24 wherein the first and second materials and the interfaces thereof form part of a first layer of the hard mask being substantially parallel to the underlying layer, and the hard mask including a second layer having material interfaces that are substantially parallel to each other and substantially different from the first direction.

26. A microfabricated device according to claim 25 the method further comprising:
forming a first layer of photoresist on the hard mask, the first layer of photoresist being in direct contact with first material and the second material;
exposing the first layer of photoresist to light using the projection system and the first photomask;
removing material from the first photoresist layer corresponding to the exposure of the first layer of photoresist, thereby uncovering certain areas of the hard mask in preparation for the first etching process; removing the first layer of photoresist after the first etching process;
forming a second layer of photoresist on the hard mask after the removal of the first layer of photoresist, the second layer of photoresist being in direct contact with first material and the second material;
exposing the second layer of photoresist to light using a second photomask; and
removing material from the second photoresist layer corresponding to the exposure of the second layer of photoresist, thereby uncovering certain areas of the hard mask in preparation for the second etching process.

27. A microfabricated device according to claim 26 wherein the underlying device layer is in direct contact with the first material and the second material.

28. A method of microfabricating devices comprising:
forming a prepatterned layer on an underlying device layer, the prepatterned layer including repeated portions of a first material and a second material having substantially different chemical properties from the first material, the repeated portions of the prepatterned layer being arranged according to a predetermined material pattern;

in a first etching process, etching portions of the first material of the prepatterned layer, the first etching process being selective to etch the first material over the second material; and in a second etching process, etching portions of the second material of the prepatterned layer, the second etching process being selective to etch the second material over the first material, the first and second etching processes forming an etched pattern in the prepatterned layer, wherein at least a portion of prepatterned layer remaining after the first and second etching processes is used as structures in the devices, the predetermined material pattern being designed prior to design of the devices.

29. A method according to claim 28 wherein the underlying device layer is in direct contact with the first material and the second material.

30. A method according to claim 28 further comprising:

forming a first layer of photoresist on the prepatterned layer, the first layer of photoresist being in direct contact with first material and the second material;

exposing the first layer of photoresist to light using a first photomask;

removing material from the first photoresist layer corresponding to the exposure of the first layer of photoresist, thereby uncovering certain areas of the prepatterned layer in preparation for the first etching process;

removing the first layer of photoresist after the first etching process;

forming a second layer of photoresist on the prepatterned layer after the removal of the first layer of photoresist, the second layer of photoresist being in direct contact with first material and the second material;

exposing the second layer of photoresist to light using a second photomask; and removing material from the second photoresist layer corresponding to the exposure of the second layer of photoresist, thereby uncovering certain areas of the prepatterned layer in preparation for the second etching process.

31. A method according to claim 28 wherein a projection system and a photomask are used to generate a first pattern in a photoresist layer in preparation for the first etching process, and the pattern transferred to the underlying layer has a minimum feature size substantially less than a minimum feature size of the first pattern in the photoresist resulting from the projection system and photomask.

32. A method according to claim 28 wherein the structures in the devices from the at least a portion of the prepatterned layer include gates for semiconductor transistors.

33. A method according to claim 32 wherein the semiconductors transistors are CMOS transistors.

34. A method according to claim 28 wherein the prepatterned layer includes a plurality of interfaces between the first material and the second material, the interfaces being substantially perpendicular to the underlying device layer.

35. A method according to claim 34 wherein the first and second materials of the prepatterned layer are arranged in a periodic pattern in which the interfaces are substantially parallel to each other in a first direction.

36. A method according to claim 35 wherein the first and second materials and the interfaces thereof form part of a first layer of the prepatterned layer being substantially parallel to the underlying layer, and the prepatterned layer including a second layer having material interfaces that are substantially parallel to each other and substantially different from the first direction.

37. A method according to claim 28 wherein the prepatterned layer includes a plurality of interfaces between the first material and the second material, the interfaces being substantially perpendicular to the underlying device layer, the predetermined material pattern being a two-dimensional regular pattern, in which a first set of the interfaces are substantially parallel to each other in a first direction, and a second set of the interfaces are substantially parallel to each other in a second direction.

38. A method according to claim 37 wherein the first and second direction are substantially perpendicular to each other.

* * * * *